United States Patent
Hoefler et al.

(10) Patent No.: US 7,113,430 B2
(45) Date of Patent: Sep. 26, 2006

(54) DEVICE FOR REDUCING SUB-THRESHOLD LEAKAGE CURRENT WITHIN A HIGH VOLTAGE DRIVER

(75) Inventors: Alexander Hoefler, Round Rock, TX (US); Khoi V. Dinh, Austin, TX (US); Robert A. Jensen, Austin, TX (US); Matthew B. Rutledge, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 563 days.

(21) Appl. No.: 10/158,991

(22) Filed: May 31, 2002

(65) Prior Publication Data

US 2003/0222307 A1 Dec. 4, 2003

(51) Int. Cl.
*G11C 16/08* (2006.01)
(52) U.S. Cl. .................. 365/185.23; 365/185.29; 365/185.18
(58) Field of Classification Search ........... 365/185.18, 365/185.23, 185.29
See application file for complete search history.

(56) References Cited

U.S. PATENT DOCUMENTS 5,751,651 A  5/1998  Ooishi ..................... 365/226
6,128,368 A *  10/2000  Yeh ........................ 379/22.03
6,272,046 B1 *  8/2001  Shimada ................. 365/185.17
6,424,098 B1 *  7/2002  Beland et al. .............. 315/224

FOREIGN PATENT DOCUMENTS

FR        2858419 A1 *  2/2005
GB        2126734 A  *  3/1984
WO        WO 00/34956    6/2000

* cited by examiner

*Primary Examiner*—Andrew Q. Tran
(74) *Attorney, Agent, or Firm*—Toler, Larson & Abel, LLP

(57) ABSTRACT

A device for reducing the effects of leakage current within electronic devices is disclosed. In one form, a high voltage driver includes a high voltage source coupled to at least one high voltage transistor and a leakage offset module coupled to at least a portion of one of the high voltage transistors. The leakage offset module includes a diode connected MOS device operable to generate an offset voltage and an MOS shunting device coupled in a parallel with the diode connected MOS device. During operation, the diode connected MOS device generates an offset voltage based on a sub-threshold leakage associated with using the high voltage source and the MOS shorting device is operable to short the diode connected MOS device when sub-threshold leakage current is relatively low.

14 Claims, 4 Drawing Sheets

LOGIC TABLE

| MODE | INPUT SELECTOR 401 | FEW OUTPUTS SELECTOR 412 | ALL OUTPUTS SELECTOR 413 | LOW VOLTAGE SELECTOR 414 |
|---|---|---|---|---|
| READ | ACTIVATED | X | ACTIVATED | ACTIVATED |
| FULL ERASE | ACTIVATED | DE-ACTIVATED | ACTIVATED | DE-ACTIVATED |
| PARTIAL ERASE (UNSELECTED) | DE-ACTIVATED | ACTIVATED | DE-ACTIVATED | DE-ACTIVATED |
| PARTIAL ERASE (SELECTED) | ACTIVATED | ACTIVATED | DE-ACTIVATED | DE-ACTIVATED |

*FIG. 5*

DEVICE FOR REDUCING SUB-THRESHOLD LEAKAGE CURRENT WITHIN A HIGH VOLTAGE DRIVER

FIELD OF THE DISCLOSURE

The disclosures herein relate generally to integrated circuits and more particularly to a device for reducing the effects of leakage current within electronic devices.

BACKGROUND OF THE DISCLOSURE

In some conventional non-volatile memories (NVMs), high voltages must be applied to bit cells to alter their states. Oversized transistors are used to route high voltages to each bit cell. Wide transistors that support the necessary drive currents typically create larger-than-normal and undesired leakage currents. For example, as the overall area of a transistor is increased to handle these high voltages, leakage currents also increase causing complications during circuit operation. To further compound the issue, NVMs typically utilize high voltages during word and page erase modes resulting in assertion of high voltages across an array of oversized transistors. This results in an aggregate of leakage currents placing a strain on the high voltage supply performance while degrading circuit efficiency.

In some low-power applications, there is an increased sensitivity to leakage currents within circuits that use high voltages for erasing and programming bit cells. High voltage levels are provided using a charge pump, a device that uses a low voltage power source to generate high voltages. Depending on the application, the charge pump and low voltage power source are sized to compensate for current leakage that occurs during high voltage operation. However, supplying additional current to overcome the leakage not only increases the erase and program mode operating currents, it also necessitates making the high voltage generation circuit larger and more complex resulting in increased circuit area and power consumption. The problem of leakage current is further exacerbated through the requirement that certain high voltage circuits must operate at elevated temperatures, e.g. at up to 150° C. This high temperature increases the undesired leakage current to even higher levels.

Several solutions currently employed by some conventional NVMs include increasing threshold voltages of the high voltage devices, creating unique devices or circuits, or back biasing the circuit's substrate with a negative power supply. Each solution presents a design limitation. For example, increasing the threshold voltage of each device is undesirable due to the increase in device size of each transistor which affects the overall performance of associated circuits. An increase in size is almost always necessary for a transistor with higher threshold voltage, since when asserted, these transistors cannot supply as much output current as transistors with lower threshold voltage can. Similarly, introducing a complex circuit design to obviate leakage adds to the overall design complexity and increases the number of fabrication processes. Additionally, back biasing the substrate with a negative power supply would require certain devices of the integrated NVM circuit to be embedded into a separate well. As such, a triple well process and a charge pump would be needed to provide the negative voltage resulting in an increased circuit area and complexity.

Therefore, a device is needed that reduces the effects of leakage current in NVMs while minimizing device size, maintaining moderate circuit complexity, and may be fabricated with minimal processing steps.

BRIEF DESCRIPTION OF THE DRAWINGS

FIG. 5 illustrates one embodiment of a logic table for the high voltage driver illustrated in FIG. 4;

DETAILED DESCRIPTION OF THE FIGURES

The disclosures made herein relate to reducing leakage currents within integrated electronic devices. Several types of leakage currents may be generated within integrated electronic devices. One type of leakage that occurs in low voltage devices includes sub-threshold currents that are generated when a high voltage source is used within a low voltage integrated circuit. In one form of the disclosure, a low power electronic device includes a high voltage source and a mode dependent selector operable to enable or disable use of the high voltage source. A leakage offset module is coupled to the high voltage source for providing an offset voltage in response to leakage current generated within the electronic device. For example, when the high-voltage source is utilized, leakage current generated as a result of using the high voltage source is detected by the leakage module. In response to detecting the leakage current, the leakage offset module provides an offset voltage to a portion of the leaking component within the electronic device. In this manner, a relative increase in biasing voltages for the leaking components within the electronic device may be provided thereby creating a substrate bias effect for select current leaking components.

According to a further aspect of the disclosure, a high voltage driver for use in association with a non-volatile memory (NVM) is disclosed. The high voltage driver is operable to provide a high voltage to a word line and/or bit cell during operations, such as write and erase operations, to alter the state of a bit cell. The high voltage driver includes a leakage offset module operable to provide an offset voltage in response to leakage current generated during selected and deselected modes of operation of the high voltage driver. The leakage offset module includes a diode connected MOS device operable to provide an offset voltage to a portion of the high voltage driver during the high voltage operation. The MOS device may be a NMOS or PMOS device having associated operating characteristics and voltage levels. For example, depending on the mode of operation of the high voltage driver, the leakage offset module may provide an offset voltage to a leaky portion of the high voltage driver.

As leakage current develops within the high voltage driver, the current is coupled to the diode connected MOS device and an offset voltage is developed by the MOS device. The offset voltage may then be applied as a source bias to the leaking component or transistor thereby providing the effect of applying a negative substrate bias to the leaking component or transistor. In this manner, the threshold voltage level for the leaking transistor is increased thereby reducing the sub-threshold leakage current of the leaking transistor. As such, the amount of current needed by the high voltage driver during high voltage operations is decreased, thereby improving the overall circuit operation efficiency of the NVM.

Figure 1:
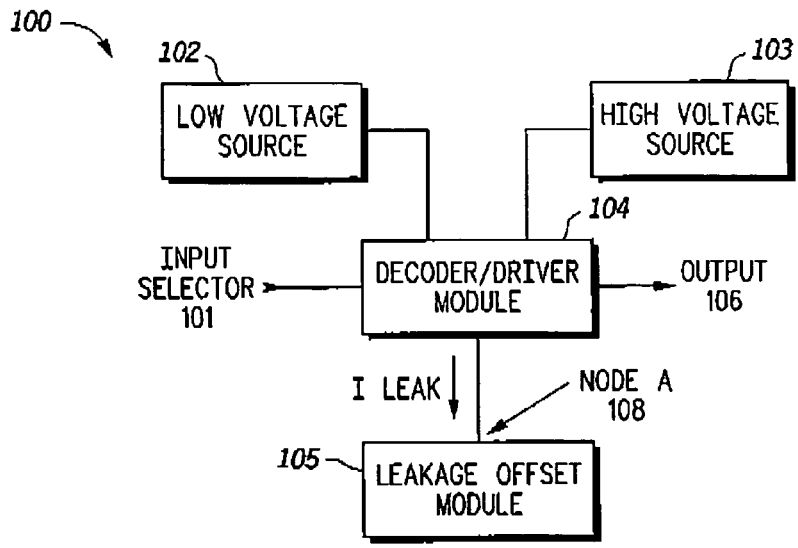
FIG. 1 illustrates a block diagram of an integrated circuit having a leakage offset module according to one aspect of the disclosure.

FIG. 1 illustrates a block diagram of an integrated circuit having a leakage offset module according to one aspect of the disclosure. Integrated circuit 100 includes a decoder module 104 coupled to a low voltage source 102 and a high voltage source 103. An input selector 101 is provided to select or deselect integrated circuit 100 and an output 106 that provides an output for decoder module 104. A leakage offset module 105 is coupled to decoder module 104 and provides an offset voltage at Node A 108 in response to leakage current I leak.

During operation, low voltage source 102 or high voltage source 103 provide a voltage level for decoder module 104 based on the operating mode of integrated circuit 100. For example, when input selector 101 is enabled (logical high), high voltage source 103 may be used to provide a high voltage output at output 108 to support a write or erase mode of operation. As such, decoder module 104 may determine the voltage source selected and couple a high voltage to output 108 resulting in a leakage current I leak being generated. Leakage offset module 105 may detect I leak and provide an offset voltage based in response to I leak. For example, leakage offset module may selectively apply an offset voltage to a leaking component within decoder module 104 thereby creating a substrate bias effect for the leaking component. In this manner, the current leakage may be reduced utilizing the offset voltage generated by leakage offset module 105.

In one embodiment, integrated circuit 100 may be used in association with a memory device such as a NVM and may include a read, write and erase operating modes. A selected mode may be provided at input selector 101 or through other mode selection circuitry (not expressly shown) operably associated with integrated circuit 100. For example, in one embodiment, integrated circuit 100 may be operably associated with a NVM and may be used to provide voltage levels during different modes of operation. For example, during a read mode, low voltage source 102 may provide a low voltage level of approximately one threshold voltage (i.e. Vt~0.7 Volts) during the read mode. As such, minimal leakage current (I leak) may be present and a voltage offset of approximately zero volts would be provided at Node A 108.

However, during an operating mode where a high voltage level shifting is necessary (e.g. erase or write) of the NVM, a relatively high voltage level is needed to alter a state within one or more bit cells coupled to output 106 via a word line (not expressly shown). For example, output 106 may be coupled to a word line operable to provide high and low voltage levels for up to 512 or more bit cells within an NVM. During the erase mode, high voltage source 103 is coupled to decoder module 104 and subsequently to output 106. With a high voltage level applied to decoder module 104, leakage current (I leak) is generated by components within decoder module 104 and coupled to leakage offset module 105. I leak is detected by leakage offset module 105 and an offset voltage is generated in response to I leak. Leakage offset module 105 may provide an offset voltage in several ways and may use current and/or voltage sensitive components configurable to provide a voltage offset level at Node A 108. For example, leakage offset module 105 may include one or more transistor elements operable to generate voltage levels in response to current I leak. Leakage offset module 105 may include a diode connected MOS device in parallel with a second MOS device operable to shunt the diode connected MOS device (not expressly shown). During periods when high voltage source 103 may invoke leakage currents, the diode connected MOS device may be coupled to the leakage current to produce an offset voltage that may be provided to the leaking component or device. Additionally, during periods when high voltage source 103 is not used to generate a high voltage, the low voltage source 102 is dominant, and the leakage current may not be significant and the second MOS device may be used to shunt the diode connected MOS device to ground. In this manner, an offset voltage may be provided to selective components during high leakage periods.

Integrated circuit 100 allows leakage current that is normally produced during high voltage utilization periods to be efficiently used by leakage offset module 105 thereby reducing the amount of current required to be provided by high voltage source 103 and increasing the overall efficiency of integrated circuit 100. Integrated circuit 100 may be used in association with several other electronic devices and is not limited to memory devices, flash modules, etc. For example, other circuits such as analog-to-digital converters, voltage detectors and/or comparators, voltage level shifters, or other devices, systems, components, etc. may also take advantage of providing offset voltages to select leaking components to increase source bias of the select components. In this manner, an effect similar to supplying a negative substrate voltage may be provided without using a negative voltage reference to reduce current leakage and increase performance efficiency of the device, component, and/or system.

Figure 2:
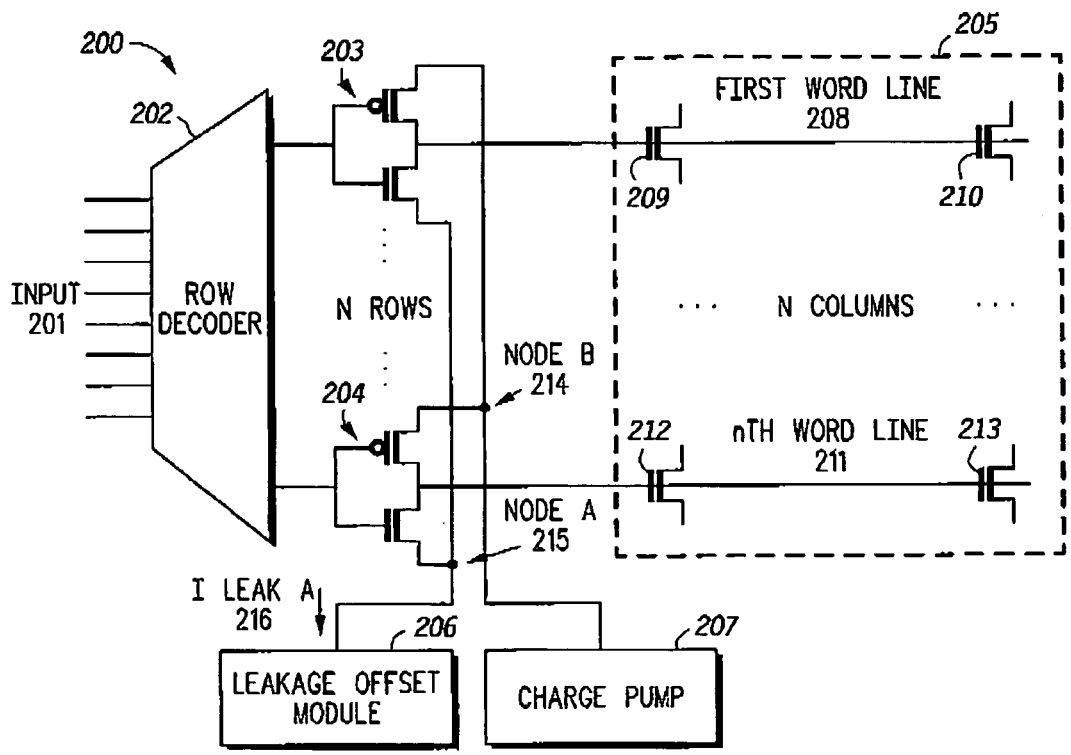
FIG. 2 illustrates a schematic diagram of a non-volatile memory device incorporating a leakage offset module and charge pump according to one aspect of the disclosure.

FIG. 2 illustrates a schematic diagram of a non-volatile memory device incorporating a leakage offset module and charge pump according to one aspect of the disclosure. Nonvolatile memory (NVM) 200 includes components similar to components illustrated in FIG. 1 such as a charge pump 207 operable as a high voltage source such as high voltage source 103, a leakage offset module 206 similar to leakage offset module 105, and high voltage drivers 203 and 204 are similar to decoder module 104. NVM 200 includes a row decoder 202 coupled to a memory array 205 via high voltage drivers such as high voltage drivers 203–204. Each high voltage driver is coupled to an associated word line operable to provide a voltage level based on a mode of operation associated for a particular row. For example, first high voltage driver 203 is coupled to first word line 208 for providing access to columns of bits associated with a selected word line that include transistors 209–210. For example, memory array 205 may include 512 columns and 2048 rows providing access to a one megabit memory array.

NVM 200 further includes a charge pump 207 operable to provide a high relative voltage level of approximately eight to sixteen volts during one or more modes of operation. NVM 200 further includes a leakage offset module 206 operable to provide an offset voltage in response to leakage current within NVM 200. For example, NVM 200 may receive an input via input 201 operable to access one or more bits during a 'read' mode of operation. In one embodiment, a multi-bit memory address such as an 8-Bit memory address may be provided via input 201 and row decoder may resolve the memory address to access a word line within memory array 205. As such, an identified row, such as word line 208, may be selected and a first column (not expressly shown) may be enabled to access first memory cell 209.

In another embodiment, NVM 200 may also be placed in an 'erase' mode where one or more wordlines (rows) may be erased. For example, an entire row may be selected to be erased (i.e. a 'page' erase). An input may be provided at input 201 identifying which row to erase and a high relative voltage level may be provided by charge pump 207 to the identified word line. For example, row decoder 202 may identify first word line 208 and first high voltage driver 203 may provide a high voltage to first word line 208. With a high voltage level present at Node B 214, leakage current I leak 216 is generated upon selecting first word line 208 and detected by leakage offset module 206. As such, leakage offset module 206 generates an offset voltage at Node A 215 that is coupled to the source of first high voltage driver 207. The offset voltage provides an effect similar to applying a negative substrate voltage without using a negative voltage reference thereby creating a relative increase in the threshold voltage of first high voltage driver 203 reducing current leakage I leak 216.

In a similar manner, all of memory array 205 may be selected to be erased (i.e. a 'block' erase). During a block erase, charge pump 207 provides a high voltage level that is coupled to each word line for erasing the contents of each bit within memory array 205. A high voltage level is coupled to first word line 208 through nth word line 211 using charge pump 207. With a high voltage level applied to each word line, I leak 216 increases and leakage offset module 206 provides an offset voltage level that is coupled to the source of each high voltage driver thereby providing an effect similar to supplying a negative substrate voltage for each high voltage driver. In this manner, a reduction in I leak occurs and the overall efficiency of NVM 200 is increased.

Figure 3:
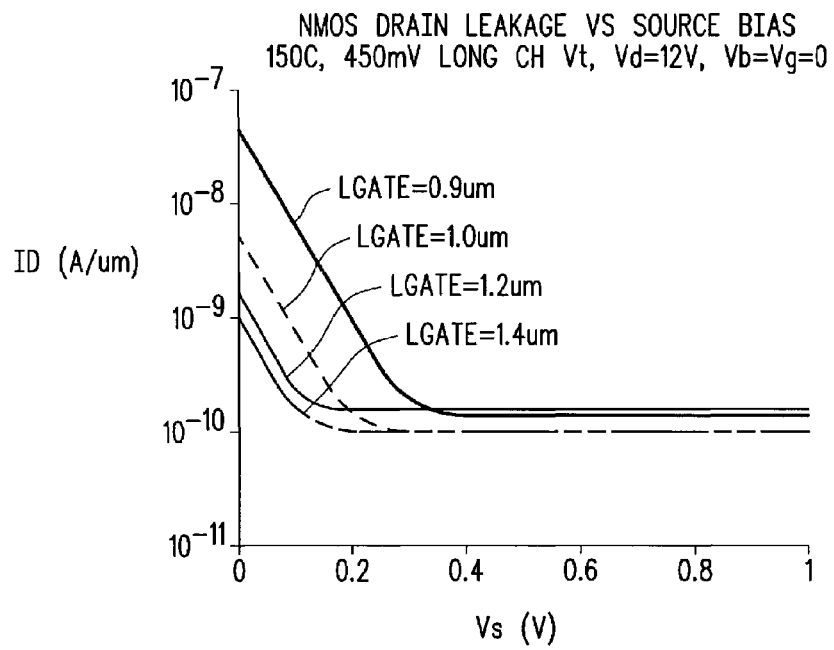
FIG. 3 graphically illustrates the effect of providing offset voltages using a leakage offset module according to one aspect of the disclosure.

FIG. 3 graphically illustrates the effect of providing offset voltages using a leakage offset module according to one aspect of the disclosure. FIG. 3 illustrates NMOS drain leakage, Id (A/um) as a function of varying source bias Vs (V) based on the length of the NMOS transistor gate length. Conditions for testing each transistor having gate lengths of 0.9 microns, 1.0 microns, 1.2 microns and 1.4 microns include providing a voltage threshold of 450 millivolts for the devices, a drain voltage (Vd) of twelve volts, a substrate bias (Vb) of zero volts and a gate voltage (Vg) of zero volts. Each voltage level may be provided relative to a zero voltage reference level (i.e. ground level) or other operating voltage level that may be associated with each transistor as needed.

As illustrated, a low source voltage results in a high level of sub-threshold current leakage. As Vs is increased, Id decreases thereby reducing the drain leakage of the NMOS transistor producing a similar effect to providing a substrate bias for the NMOS transistor. For example, providing a Vs of greater than approximately 400 millivolts results in a decrease in Id from approximately 5 nA/um to 100 pA/um for a 1.0 um gate length. As such, through providing a leakage offset module operable to couple a voltage offset of approximately one threshold voltage level (i.e. 500–600 millivolts) to a leaking transistor or device, leakage current Id may be reduced to approximately 100 pA/um for a 1.0 um gate resulting in a reduction in the amount of current needed to be supplied by a high voltage source and/or charge pump.

Figure 4:
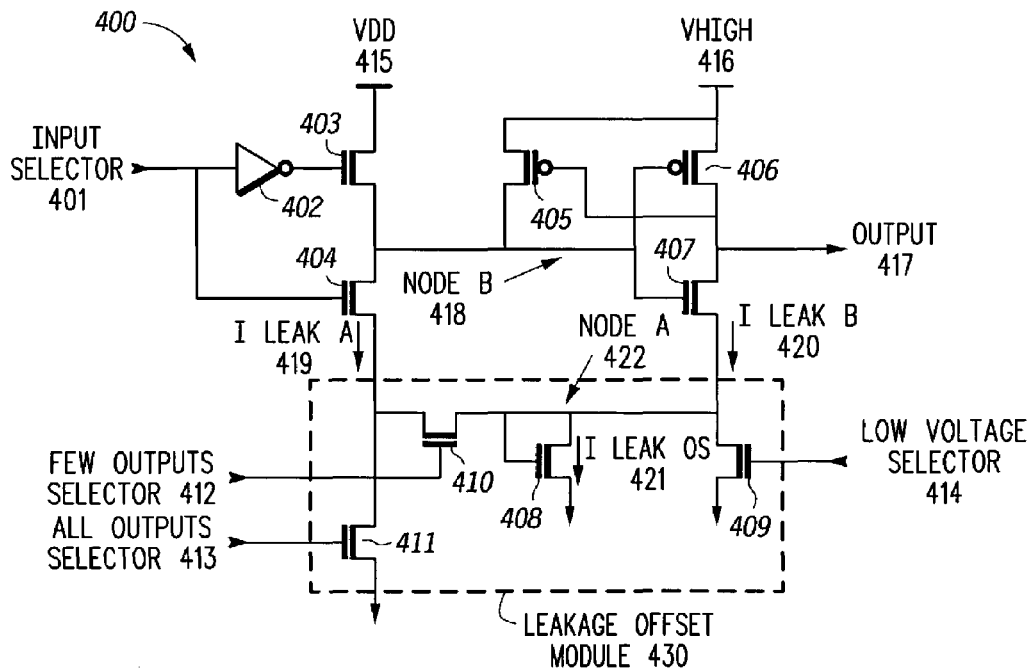
FIG. 4 illustrates a schematic diagram of a high voltage driver incorporating leakage offset components according to one aspect of the disclosure.

FIG. 4 illustrates a schematic diagram of a high voltage driver incorporating a leakage offset module according to one aspect of the disclosure. High voltage driver 400 includes an input selector 401 coupled to inverter 402 and second input selector transistor 404. First input selector transistor 403 is coupled to low voltage source (VDD) 415 and to Node B 418. High voltage driver 400 further include a first high voltage transistor 405, second high voltage transistor 406 and third high voltage transistor 407. Output 417 is coupled between second transistor 406 and third transistor 407 and is operable to provide a voltage level to a word line, bit, etc. in response to an operating mode determined by high voltage driver 400.

High voltage decoder 400 further includes a leakage offset circuitry for reducing the effects of leakage current within high voltage driver 400. A leakage offset transistor 408 includes a diode connected NMOS device operable to provide an offset voltage of approximately one voltage threshold at Node A 422. A few outputs selector 412 is coupled to few outputs selector transistor 410 and may be activated during a partial erase mode (e.g. page erase) of a memory array (not expressly shown). All outputs selector 413 is coupled to all outputs selector transistor 411 and is activated during a full memory array erase mode (e.g. block erase). A low voltage selector 414 is provided for low voltage operation of high voltage driver 400 and is coupled to low voltage selector transistor 409.

During operation of high voltage driver 400, leakage current may occur via I leak A 419 and/or I leak B 420 depending on the state provided at input selector 401. For example, high voltage driver 400 may be used in association with accessing a memory location within a memory array coupled to output 417. Output 417 may be coupled to a word line of the memory array thereby providing access to one or more bit cells within the memory array. As such, input selector 401 may be enabled or disabled (logic high or low) based on a mode of operation for accessing the memory array. If the input selector is disabled (unselected), I leak A 419 occurs within high voltage driver 400. When input selector 401 is enabled (selected), I leak B 420 occurs within high voltage driver 400. Subsequently, a voltage level is provided at Node A 422 based on the mode of operation for of high voltage driver and an associated memory array.

High voltage driver 400 advantageously allows for reducing the effect of I leak A 419 and I leak B 420 through selectively increasing or decreasing the voltage level at Node A 422 and Node B 418. FIG. 5 illustrates one embodiment of a logic table for the high voltage driver illustrated in FIG. 4. During a 'read' mode or when decoding is occurring, input selector 401 is activated enabling second input selector transistor 404. Additionally, outputs selector 413 and low voltage selector 414 are placed in an 'active' state thereby enabling all outputs selector transistor 411 and low voltage selector transistor 414 respectively. With all outputs selector transistor 411 active, a ground reference is placed at Node B 419 coupling I leak A 419 to ground. Additionally, with low voltage selector transistor 414 active, ground is placed at Node A 422 providing a low voltage logic level. As such, minimal leakage current is generated by integrated circuit 400.

During a 'partial erase (selected)' mode of operation, a small portion (i.e. one or more wordlines) of a memory array is erased. VHigh 416 is needed at output 417 to provide an erase voltage level for a word line coupled to output 417. With a input selector 401 enabled, a high voltage operating condition is presented which increases sub-threshold currents resulting in an increase in I leak B 420. After an initial address decoding and a word line selection is provided to input selector 401, a low voltage is applied to all outputs selector transistor 411 via all outputs selector 413 and also to low voltage selector transistor 409 via low voltage selector 414 thereby deactivating each respective transistor. Additionally, a high voltage is applied to few outputs selector transistor 410 via few outputs selector 412 activating few outputs selector transistor 410. This mode couples I Leak A 419 and I Leak B 420 to Node A 422 and the cumulative effect of each leakage current combines into I Leak OS 421. As I Leak OS 421 increases, the voltage level at Node A 422 is increased above ground. As the voltage level at Node A 422 is increased to approximately one threshold voltage level a balancing effect between I Leak B 420 and I Leak OS 421 occurs until I Leak B 420 is reduced to a low level in response to the offset voltage at Node A 422.

During a 'partial erase (unselected)' mode of operation high voltage driver 400 may be attached to a wordline that is not intended to be erased and input selector 401 is disabled thereby activating first input selector transistor 403. All output selector 413 is low thereby deactivating all outputs transistor 411 and low voltage selector 414 is low deactivating low voltage selector transistor 409. With input selector 401 disable, I leak A 419 is increased and as such few inputs selector 412 is enabled thereby activating few outputs selector transistor 412. I leak A 419 is then coupled to first leakage offset transistor 408 and I leak OS 421 is increased as I leak A 419 increases. As a result of I leak A 419 increasing, an offset voltage is provided at Node A 422 and is provided coupled to the source of second input selector transistor 401 thereby reducing I leak A 419.

During a 'full array' erase mode of operation, a full memory array or a block, associated with high voltage driver 400 is erased. After an initial word line selection phase, low voltage selector 414 and few outputs 412 are disabled thereby deactivating low voltage selector transistor 409 and few outputs transistor 410. Additionally, all outputs selector 413 is enabled activating all outputs transistor 411. With all outputs transistor 411 active, a ground is placed at Node B 418 and I leak B 420 is coupled to Node A 422. As leakage current I leak B 420 increases, I Leak OS 421 increases and a threshold voltage level for first leakage offset transistor 408 is present at Node A 422. With Node A 422 at approximately 0.5 to 0.6 volts, the source of third high voltage transistor 407 and second high voltage transistor 406 is coupled to the offset voltage at Node A 422 providing an effect similar to supplying a negative substrate voltage without using a negative voltage reference for each transistor and reducing I Leak B 420 to a minimal level.

Figure 6A:
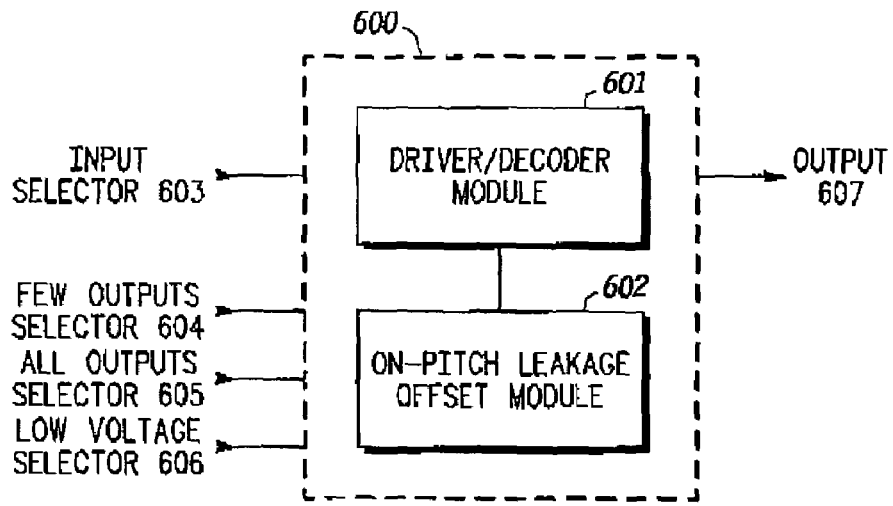
FIG. 6A schematically illustrates one embodiment of an integrated circuit incorporating an on-pitch leakage offset module.

FIG. 6A schematically illustrates one embodiment of an integrated circuit incorporating an on-pitch leakage offset module. Integrated circuit 600 includes a driver module 601 similar to high voltage driver 400 of FIG. 4 and coupled to an on-pitch leakage offset module 602 operable to provide an offset voltage based on inputs provided at input selector 603, few outputs selector 604, all outputs selector 605 and low voltage selector 606. Output 607 may be coupled to a word line, bit cell, etc. for accessing a portion of a memory device (not expressly shown). During use, a desired mode of operation is provided to integrated circuit 600 and on-pitch leakage offset module 602 provides an offset voltage based on the operating mode. For example, during an erase mode on-pitch leakage offset module 602 provides an offset voltage to reduce leakage currents caused during high voltage operation of driver module 601. On-pitch leakage offset module 602 is integrated as a part of integrated circuit 600 and is fabricated based on the same pitch or height level specifications as required by all other components within integrated circuit 600.

Figure 6B:
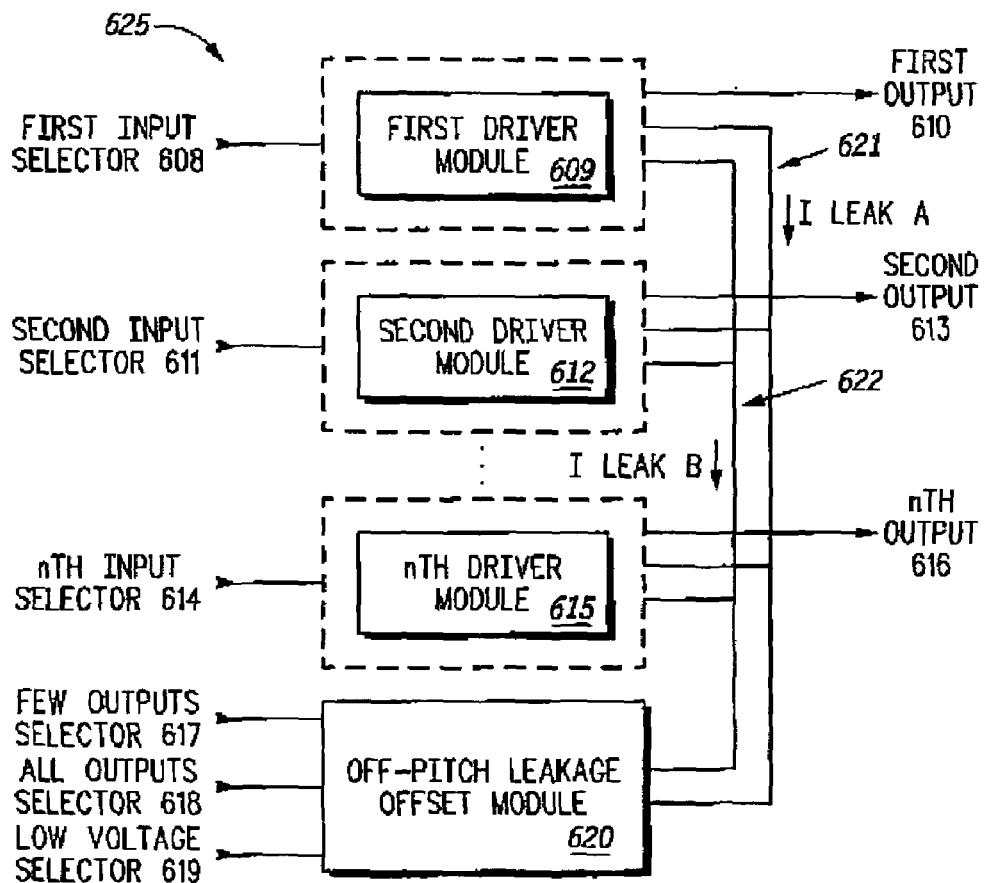
FIG. 6B schematically illustrates one embodiment of an integrated circuit incorporating an off-pitch leakage offset module.

FIG. 6B schematically illustrates one embodiment of an integrated circuit incorporating an off-pitch leakage offset module. Integrated circuit 625 includes a first input selector 608 coupled to a first driver module 609, a second input selector 611 coupled to a second driver module 612, and an nth input selector coupled to an nth driver module 615. Integrated circuit 625 further includes an off-pitch leakage offset module 620 having a few outputs selector 617, an all outputs selector 618, and a low voltage selector 619. Off-pitch leakage offset module 620 detects leakage I leak A through first coupling element 621 operably coupled to first driver module 609, second driver module 612 and nth driver module 623. Similarly, off-pitch leakage offset module 620 detects leakage I leak B through second coupling element 622 operably coupled to first driver module 609, second driver module 612, and nth driver module 620. Though illustrated as a single coupling element, it should be understood that coupling elements 621 and 622 may be data bus having associated logic and may be used to selectively couple one or more driver modules to off-pitch leakage offset module 620 to detect leakage associated with integrated circuit 625.

Off-pitch leakage module 620 is provided as a separate module from each driver module and reduces the amount of area and circuit height requirement presented by on-pitch leakage offset module 602. For example, integrated circuit 600 illustrated in FIG. 6A includes on-pitch leakage module 602 having limited pitch requirements. Additionally, separate selectors are required for each driver module 601 used within integrated circuit 600. FIG. 6B advantageously allows for reducing design limitations presented by using on-pitch circuits through moving leakage offset module 602 off-pitch separate from each driver module. This allows for flexibility when designing an integrated circuit using an on leakage offset module.

In the preceding detailed description, reference has been made to the accompanying drawings that form a part hereof, and in which are shown by way of illustration specific embodiments in which the disclosure can be practiced. These embodiments and certain variants thereof, have been described in sufficient detail to enable those skilled in the art to practice the disclosure. It is to be understood that other suitable embodiments can be utilized and that logical, mechanical, chemical and electrical changes can be made without departing from the spirit or scope of the disclosure.

For example, the disclosure has been described with respect to non-volatile memory devices (NVMs), however, it will be appreciated that other integrated circuit utilizing high relative voltage in low voltage applications can be realized using the techniques, devices, and optimization methods described herein. In addition, it will be appreciated that the functional blocks shown in the figures could be further combined or divided in a number of manners without departing from the spirit or scope of the disclosure. The preceding detailed description is, therefore, not intended to be limited to the specific forms set forth herein, but on the contrary, it is intended to cover such alternatives, modifications, and equivalents, as can be reasonably included within the spirit and scope of the appended claims.

What is claimed is:

1. A method for reducing the effects of leakage in an electronic device comprising the steps of:

detecting a sub-threshold leakage current associated with a portion of a high voltage driver operable to output a high voltage level; and applying an offset voltage to the portion of the high voltage driver in response to detecting the sub-threshold leakage current.

2. The method of claim 1 further comprising routing the offset voltage to a source of a transistor associated with the portion of the high voltage driver.

3. The method of claim 1 further comprising:
enabling an MOS device connected in parallel to a diode connected MOS device during periods of low relative sub-threshold current leakage; and
disabling the MOS device connected in parallel to the diode connected MOS device during periods of high relative sub-threshold current leakage, the disabling operable to initiate providing the offset voltage level.

4. The method of claim 3 further comprising coupling a leakage offset module to the high voltage driver during periods of high relative sub-threshold current leakage.

5. The method of claim 4 further comprising coupling the high voltage level to an output operably associated with a memory array, the high voltage level operable to alter a state of a portion of the memory array.

6. The method of claim 5 further comprising providing an operating mode operable to initiate erasing all of the memory array including:
disabling a low voltage selector transistor coupled to the leakage offset module;
enabling an all outputs selector transistor coupled between a ground reference and a portion of at least one of the high voltage driver; and
disabling a few outputs selector transistor coupled between the all outputs selector transistor and the leakage offset module.

7. The method of claim 5 further comprising providing an operating mode operable to initiate erasing a portion of the memory array including:
disabling a low voltage selector transistor coupled to the leakage offset module;
disabling an all outputs selector transistor coupled between a ground reference and a portion of at least one of the high voltage driver; and
enabling a few outputs selector transistor coupled between the all outputs selector transistor and the leakage offset module.

8. A device comprising
means for detecting a sub-threshold leakage current associated with a portion of a high voltage driver operable to output a high voltage level; and
means for applying an offset voltage to the portion of the high voltage driver in response to detecting the sub-threshold leakage current.

9. The device of claim 8 further comprising means for routing the offset voltage to a source of a transistor associated with the portion of the high voltage driver.

10. The device of claim 8 further comprising:
means for enabling an MOS device connected in parallel to a diode connected MOS device during periods of low relative sub-threshold current leakage; and
means for disabling the MOS device connected in parallel to the diode connected MOS device during periods of high relative sub-threshold current leakage, the disabling operable to initiate providing the offset voltage level.

11. The system of claim 8 further comprising means for coupling a leakage offset module to the high voltage driver during periods of high relative sub-threshold current leakage.

12. The devise of claim 11 further comprising means for coupling the high voltage level to an output operably associated with a memory array, the high voltage level operable to alter a state of a portion of the memory array.

13. The devise of claim 12 further comprising means for providing an operating mode operable to initiate erasing all of the memory array including:
means for disabling a low voltage selector transistor coupled to the leakage offset module;
means for enabling an all outputs selector transistor coupled between a ground reference and a portion of at least one of the high voltage driver; and
means for disabling a few outputs selector transistor coupled between the all outputs selector transistor and the leakage offset module.

14. The device of claim 12 further comprising means for providing an operating mode operable to initiate erasing a portion of the memory array including:
means for disabling a low voltage selector transistor coupled to the leakage offset module;
means for disabling an all outputs selector transistor coupled between a ground reference and a portion of at least one of the high voltage driver; and
means for enabling a few outputs selector transistor coupled between the all outputs selector transistor and the leakage offset module.

* * * * *

UNITED STATES PATENT AND TRADEMARK OFFICE
CERTIFICATE OF CORRECTION

PATENT NO.      : 7,113,430 B2  Page 1 of 1
APPLICATION NO. : 10/158991
DATED           : September 26, 2006
INVENTOR(S)     : Alexander Hoefler et al.

It is certified that error appears in the above-identified patent and that said Letters Patent is hereby corrected as shown below:

Column No. 10, Line No. 16 change "system" to --device--

Column No. 10, Line No. 20 change "devise" to --device--

Column No. 10, Line No. 24 change "devise" to --device--

Signed and Sealed this

Second Day of January, 2007

JON W. DUDAS
*Director of the United States Patent and Trademark Office*